United States Patent
Wimpenny

(10) Patent No.: US 9,385,680 B2
(45) Date of Patent: Jul. 5, 2016

(54) CREST FACTOR REDUCTION APPLIED TO SHAPING TABLE TO INCREASE POWER AMPLIFIER EFFICIENCY OF ENVELOPE TRACKING AMPLIFIER

(71) Applicant: SNAPTRACK, INC., San Diego, CA (US)

(72) Inventor: Gerard Wimpenny, Cambridge (GB)

(73) Assignee: SnapTrack, Inc., San Diego, CA (US)

(*) Notice: Subject to any disclaimer, the term of this patent is extended or adjusted under 35 U.S.C. 154(b) by 0 days.

(21) Appl. No.: 13/742,506

(22) Filed: Jan. 16, 2013

(65) Prior Publication Data

US 2014/0028370 A1 Jan. 30, 2014

(30) Foreign Application Priority Data

Jan. 16, 2012 (GB) .................................. 1200628.4

(51) Int. Cl.
*H03G 3/20* (2006.01)
*H03G 11/04* (2006.01)
*H03F 3/189* (2006.01)
*H03F 1/02* (2006.01)

(52) U.S. Cl.
CPC ............ *H03G 11/04* (2013.01); *H03F 1/0222* (2013.01); *H03F 1/0227* (2013.01); *H03F 3/189* (2013.01); *H03F 2200/102* (2013.01)

(58) Field of Classification Search
CPC .... H03G 3/3042; G01R 13/02; H03F 1/0211; H03F 2200/20; H03F 2000/78; H03F 2200/24; H03F 3/189; H03F 3/20
USPC .......... 330/127, 135, 136; 327/560–562, 309, 327/318
See application file for complete search history.

(56) References Cited

U.S. PATENT DOCUMENTS

| | | | |
|---|---|---|---|
| 5,420,536 A | 5/1995 | Faulkner et al. | |
| 6,141,541 A | 10/2000 | Midya et al. | |
| 7,091,777 B2 * | 8/2006 | Lynch | 330/136 |
| 7,095,278 B2 * | 8/2006 | Fuller et al. | 330/149 |
| 7,554,396 B2 * | 6/2009 | Kim | H03C 1/36 |
| | | | 330/136 |
| 8,145,148 B2 * | 3/2012 | Matsuura | 455/110 |
| 8,457,246 B2 * | 6/2013 | Kim et al. | 375/295 |
| 8,570,105 B2 * | 10/2013 | Wimpenny et al. | 330/136 |
| 9,002,303 B2 * | 4/2015 | Brobston | H03F 1/0266 |
| | | | 455/127.1 |

(Continued)

FOREIGN PATENT DOCUMENTS

| | | |
|---|---|---|
| EP | 1569330 A1 | 8/2005 |
| EP | 1569359 A1 | 8/2005 |
| GB | 2476393 A | 6/2011 |
| WO | 2007143844 A1 | 12/2007 |

OTHER PUBLICATIONS

International Search Report and Written Opinion: Mailed Apr. 25, 2013 for corresponding PCT Application No. PCT/EP2013/050708.

(Continued)

*Primary Examiner* — Dinh T Le

(57) ABSTRACT

There is disclosed a method of controlling an input to an envelope modulated power supply of an envelope tracking amplification stage, comprising: generating an envelope signal representing the envelope of a signal to be amplified; applying a shaping function to the envelope signal to generate a shaped envelope signal, including: clipping the shaped envelope signal at high input envelope values; and providing the shaped envelope signal as an input signal to the envelope modulated power supply.

20 Claims, 8 Drawing Sheets

(56) References Cited

U.S. PATENT DOCUMENTS

| | | | |
|---|---|---|---|
| 9,116,183 B2* | 8/2015 | Cummins | H03F 1/0222 |
| 2005/0110562 A1 | 5/2005 | Robinson et al. | |
| 2007/0258602 A1* | 11/2007 | Vepsalainen et al. | 381/104 |
| 2010/0295613 A1 | 11/2010 | Asbeck et al. | |
| 2012/0264380 A1* | 10/2012 | Cobley | H03F 1/0222 455/77 |

OTHER PUBLICATIONS

British Search Report dated May 24, 2012, for British Application No. 1200628.4, filed on Jan. 16, 2012 (3 pages).
International Preliminary Report on Patentability and Written Opinion; Mailed Jul. 31, 2014 for the corresponding PCT Application No. PCT/EP2013/050708.

* cited by examiner

CREST FACTOR REDUCTION APPLIED TO SHAPING TABLE TO INCREASE POWER AMPLIFIER EFFICIENCY OF ENVELOPE TRACKING AMPLIFIER

FIELD OF THE INVENTION

The invention relates to techniques for achieving efficient amplification of non-constant envelope signals. The invention particularly relates to the use of envelope tracking power supplies for amplification, incorporating shaping functions for shaping the envelope signal.

The invention particularly, but not exclusively, relates to the amplification of radio frequency (RF) signals.

DESCRIPTION OF THE RELATED ART

Many modern communication systems typically use non-constant envelope modulation techniques to achieve high spectral efficiency. To avoid spectral spreading into adjacent communication channels, high linearity radio frequency (RF) amplification is required. Traditional fixed bias amplifiers can only achieve the required linearity by 'backing off' the amplifier so that it normally operates at a power well below its peak power capability. Unfortunately, the DC to RF power conversion efficiency in this region is very low. As a consequence these designs dissipate considerable heat and reduce battery life when used in portable applications.

Maximisation of battery life is of paramount importance in mobile wireless equipment for example. With most high spectral efficiency communication standards, the mobile transmitter operates at considerably less than maximum power most of the time. There are two reasons for this. Firstly, power control is generally used to reduce the average transmit power to the minimum level required for reliable communication, and secondly most emerging modulation schemes have a high peak-to-average power ratio. Hence it is important for the power amplifier to maintain high efficiency at powers significantly below maximum, where the power amplifier operates most of the time.

A known technique for increasing amplifier efficiency, "envelope tracking" (ET), uses a supply modulator to modulate the supply voltage substantially in line with the envelope of the input RF signal. To achieve highest overall efficiency, the efficiency of the supply modulator itself must be high, requiring the use of a switched mode DC-DC converter for the modulator. The design of the supply modulator is critical to the system performance of the amplifier. In addition to achieving good efficiency, the modulator must also exhibit high bandwidth, high linearity and low noise to be useful in modern communications applications which typically use high bandwidth CDMA or OFDM modulation schemes and also demand high modulation accuracy.

An improved linearization approach uses an envelope voltage to implement a voltage mapping (or shaping) function to achieve constant gain from the RF amplifier, thereby reducing the need for pre-distortion or feedback. The mapping (or shaping) function between the envelope voltage and supply voltage may use a continuous function, in which the envelope voltage may be uniquely derived from knowledge of the supply voltage.

It is an aim of the invention to provide an improved envelope tracking power amplifier arrangement in which a shaping function is used to shape the envelope signal provided to a modulated power supply.

SUMMARY OF THE INVENTION

In accordance with the invention there is provided a method of controlling an input to an envelope modulated power supply of an envelope tracking amplification stage, comprising: generating an envelope signal representing the envelope of a signal to be amplified; applying a shaping function to the envelope signal to generate a shaped envelope signal, including: clipping the shaped envelope signal at high input envelope values; and providing the shaped envelope signal as an input signal to the envelope modulated power supply.

The step of introducing clipping into the shaped envelope preferably results in reduction of the crest factor of the amplifier output signal. The step of introducing clipping into the shaped envelope preferably results in increased average power and increased power amplifier efficiency.

The method may further comprise adjusting the sharpness of the clipping.

The clipping level of the shaped envelope signal may be adjusted in dependence on the average transmitter power.

The clipping level of the shaped envelope signal may be reduced when the transmitter average power is reduced.

The step of introducing clipping into the shaped envelope may comprise scaling the input to and/or output from the shaping table.

The step of introducing clipping into the shaped envelope may comprise replacing an existing shaping function with a modified shaping function.

The invention further provides a method of controlling an envelope tracking amplification stage comprising an envelope modulated power supply, the method comprising: determining a clipping level to be applied to an envelope signal as part of shaping the envelope signal for controlling the envelope modulated power supply.

The method may further comprise determining a sharpness of the clipping level.

The clipping level may be the lowest possible clipping level that can be applied without exceeding frequency distortion requirements.

The invention also provides an envelope tracking amplification stage including an envelope modulated power supply and an amplifier, comprising: a shaping table for applying a shaping function to a signal representing the envelope of the signal to be amplified to generate a shaped envelope signal, wherein the shaping table is adapted to clip the shaped envelope signal at high input envelope values.

The envelope tracking amplification stage of claim 12 wherein the introduction of clipping into the shaped envelope results in reduction of the crest factor of the amplifier output signal.

The introduction of clipping into the shaped envelope preferably results in increased average power and increased power amplifier efficiency.

The shaping table may be further adapted to adjust the sharpness of the clipping.

The shaping table may be adapted to adjust the clipping level of the shaped envelope signal in dependence on the average transmitter power.

The shaping table may be adapted to adjust the clipping level of the shaped envelope signal when the transmitter average power is reduced.

The envelope tracking amplification stage may further comprise a scaling block for clipping the input and/or the output the shaping table.

The envelope tracking amplification stage may be adapted to replace an existing shaping function with a modified shaping function.

BRIEF DESCRIPTION OF THE FIGURES

The invention is now described by way of reference to the accompanying Figures, in which.

DESCRIPTION OF THE PREFERRED EMBODIMENTS

The invention is now described by way of example with reference to exemplary arrangements. The invention is not limited to the details of any described arrangement unless expressly stated. Aspects of the exemplary arrangements may be implemented in different combinations, and the invention is not limited to a specific combination of features by virtue of the presentation of an exemplary combination for the purposes of explaining the invention.

Figure 1:
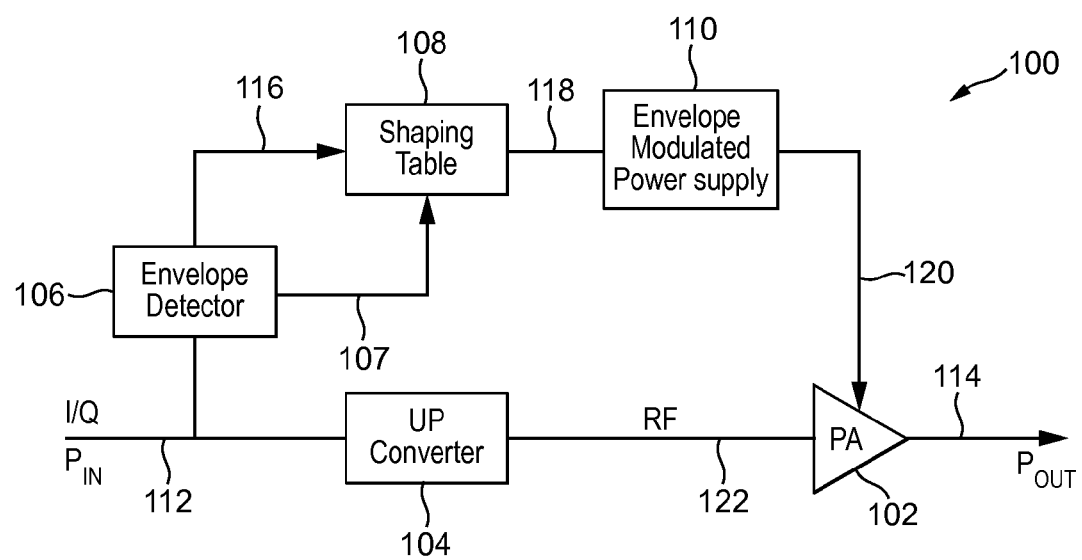
FIG. 1 illustrates an exemplary amplification system in which improvements in accordance with the invention and its embodiments may be implemented.

FIG. 1 illustrates an exemplary envelope tracking radio frequency (RF) power amplifier system 100 in which improvements in accordance with embodiments of the present invention may be implemented. The envelope tracking power amplifier system 100 includes a power amplifier 102, an up-converter 104, an envelope detector 106, a shaping table 108, and an envelope modulated power supply 110.

An input I/Q signal on line 112 forms an input to the up-converter 104, which generates an RF input signal for the RF power amplifier on line 122. The instantaneous power of the input I/Q signal is denoted $P_{IN}$. The input I/Q signal on line 112 also forms an input to the envelope detector 106, which generates an envelope signal representing the envelope of the input I/Q signal at its output on line 116. The envelope detector 106 additionally may generate, as illustrated in the arrangement of FIG. 1, a control signal on line 107 to the shaping table 108. In an alternative arrangement this control signal for the shaping table may be provided directly from baseband processing circuitry (not shown). The envelope signal on line 116 is provided as an input to the shaping table 108. The output of the shaping table on line 118 provides an input to the envelope modulated power supply, which in dependence thereon provides the supply voltage to the RF power amplifier on line 120. The RF power amplifier generates an amplified RF output signal at its output on line 114. The instantaneous power of the RF output signal is denoted $P_{OUT}$.

The up-converter 104 converts the input I/Q signal on line 112 into an RF signal for amplification. The envelope detector receives the I/Q signal on line 112, and generates an envelope signal at its output which represents the envelope of the input signal, i.e. provides a signal representing the magnitude of the envelope signal.

The implementation of the envelope modulated power supply 110 is outside the scope of the present invention, and one skilled in the art will appreciate that it may be implemented in a number of ways. Typically the envelope modulated power supply 110 includes a switched voltage supply in which one of a plurality of supply voltages can be selected in dependence on the instantaneous magnitude of the envelope signal provided by the shaping table. In an efficient amplification scheme, the selected supply voltage may then be further adjusted to provide a more accurate representation of the instantaneous envelope signal, before being provided to the RF power amplifier as the supply voltage. The invention is not limited to any specific implementation of an envelope modulated power supply.

The power amplifier 102 may be implemented as a single stage or multi-stage amplifier.

The shaping table 108 is a functional block for shaping the envelope signal, and applies a shaping function to the envelope signal on line 116 to provide a shaped envelope signal on line 118. The shaping function applied is determined by a control signal received—in the exemplary arrangement of FIG. 1—from the envelope detector on line 107. The control signal may determine which shaping function, amongst a plurality of shaping functions, is applied to the envelope signal. The control signal may simply be a signal representing the average power of the I/Q input signal on line 112. The shaping of the envelope signal influences the efficiency and linearity of the power amplifier 102.

The amplification stage 100 is characterised in a pre-operation phase to determine the optimum instantaneous supply voltage level for a given input (I/Q) signal level in order to meet particular system objectives.

This characterisation of the amplification stage 100 may require multiple power sweeps of the amplification stage. This characterisation may include measurement of various power amplifier parameters, including supply voltage; bias voltage; RF gain; RF phase; supply current; RF input power; and RF output power.

In general, the parameters of the device are measured which are necessary to determine a particular performance characteristic or objective. If, for example, it is desired to optimise the gain of the amplification stage, then those parameters necessary to determine gain are measured for different input (envelope) signal and supply voltage combinations.

A measurement database for a given amplification stage may thus be established following a characterisation process. The resulting measurement database can be used to predict the operational system performance of the device, based on the instantaneous input parameters and the choice of shaping function. In use, in dependence on a characteristic of an input signal to the amplifier, such as the average power of the input signal to the amplifier, the data obtained in the characterisation operation is interrogated to determine the best shaping function to apply to the input signal to ensure the shaped envelope signal to the envelop modulated power supply is optimised for meeting the decided performance characteristic.

The characterisation of the amplifier stage may be carried out in a number of ways, and the invention is not limited to a specific characterisation technique. Most conveniently the characterisation may be carried out using automated test equipment.

Figure 2A:
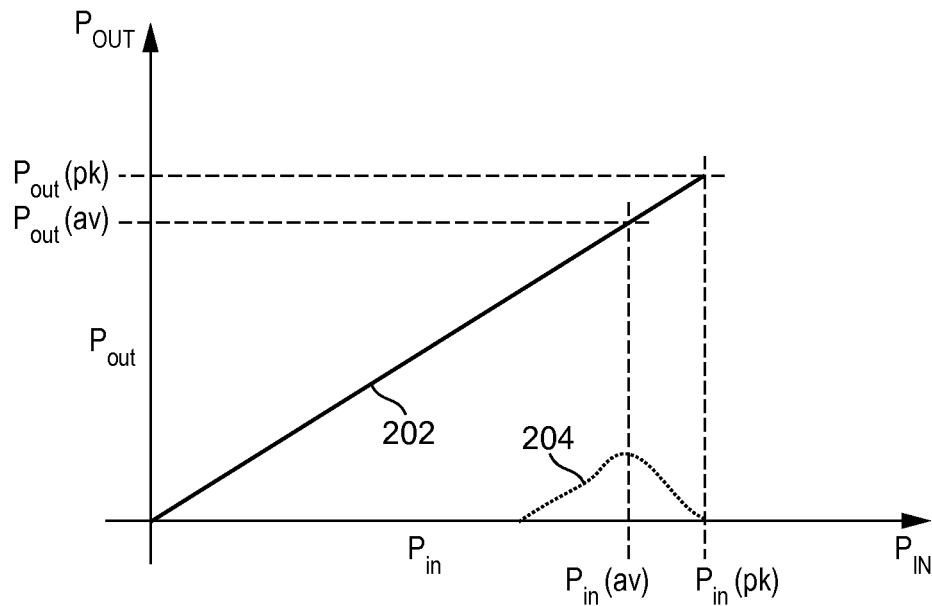
FIGS. 2(a) and 2(b) illustrate plots of input power against output power for exemplary linear and non-linear amplifiers.

FIG. 2(a) illustrates a plot 202 of instantaneous output power, $P_{OUT}$, against instantaneous input power, $P_{IN}$, for a linear amplifier. FIG. 2(a) also illustrates a plot 204 of a probability density function of the input signal to the amplifier. The crest factor $P_{IN(PK)}/P_{IN(AV)}$ of the input signal (i.e. the ratio of peak input power to average input power) and the crest factor $P_{OUT(PK)}/P_{OUT(AV)}$ of the output signal (i.e. the ratio of peak output power to average output power) are the same in such a linear amplifier.

Figure 2B:
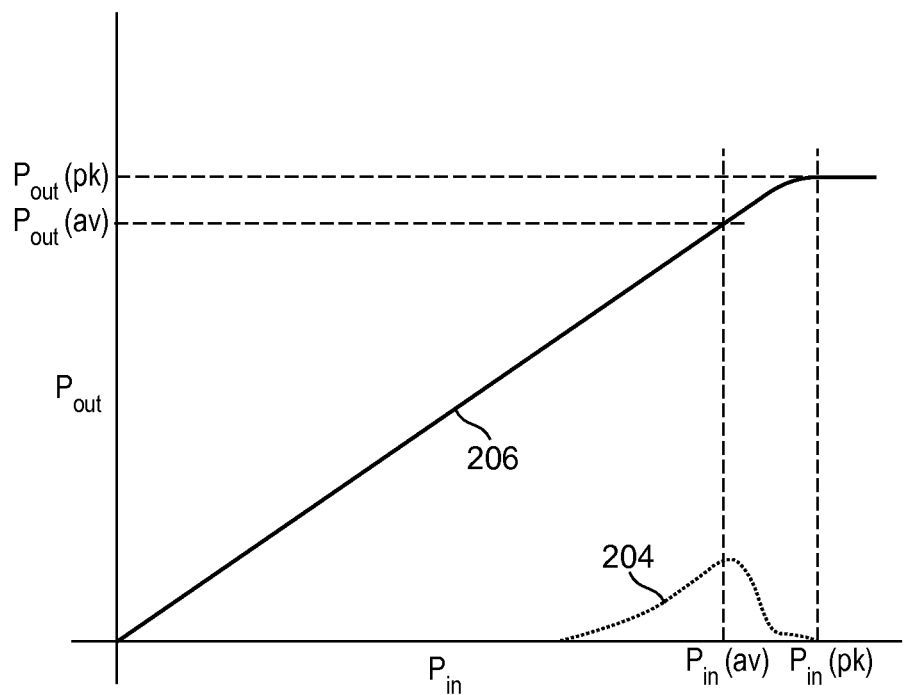

FIG. 2(b) illustrates a plot 206 of instantaneous output power, $P_{OUT}$, against instantaneous input power, $P_{IN}$, for an amplifier which exhibits compression at high power. The crest factor of the output signal, $P_{OUT(PK)}/P_{OUT(AV)}$, is now lower than the crest factor of the input signal, $P_{IN(PK)}/P_{IN(AV)}$. The non-linear amplifier has therefore reduced the crest factor of the input signal relative to the linear amplifier arrangement, and so may be considered to have implemented crest factor reduction (CFR).

The term compression can be understood as follows. As illustrated in FIG. 2(b), once the output power reaches a level $P_{OUT(PK)}/$, it rises no further even as the input power rises, and the amplifier is then in compression. In the compression region of operation of the amplifier, the output power of the amplifier is dependent upon the supply voltage. In the linear region of operation the amplifier is dependent upon the input power to the amplifier.

The principles described above apply to any amplifier system, including conventional fixed supply amplifiers as well as envelope tracking amplifiers. In the case of a fixed supply amplifier, the compression characteristic is determined primarily by the fundamental characteristics of the amplifier technology (e.g. CMOS, bipolar etc.), and there is limited scope for the amplifier designer to influence the shape of the compression characteristic.

For an envelope tracking amplifier in accordance with the present invention, the data obtained through the characterisation of the device is used to derive a shaping function which imposes controlled amplitude compression at high instantaneous output power.

In contrast to the fixed supply amplifier, the shape of the compression characteristic of the envelope tracking amplifier may be directly controlled by the envelope shaping table, and may be regarded as being 'soft programmable'. For example, the shaping table values may be chosen to achieve constant amplifier gain, or to achieve gain compression at high power.

As the shape of the compression characteristic is 'programmable' the frequency domain characteristics of the resulting power amplifier distortion may also be controlled.

Figure 3:
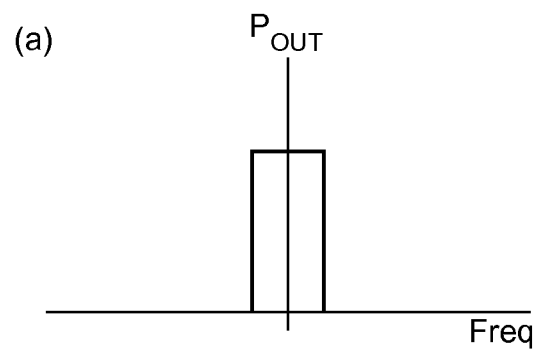
FIGS. 3(a) to 3(c) illustrate the spectral characteristics of exemplary signals.
Figure 3:
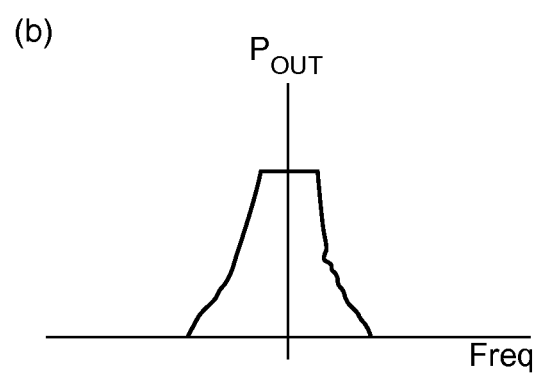
Figure 3:
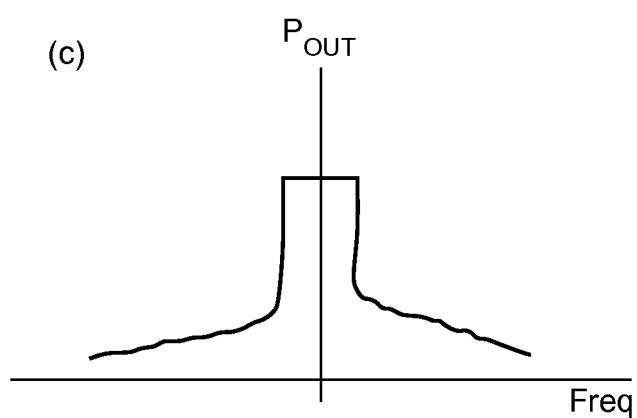

To illustrate these considerations, FIG. 3(a) shows the spectral characteristics of an ideal linear amplifier. FIG. 3(b) shows the spectral characteristics of an amplifier with a soft compression characteristic, and FIG. 3(c) shows the spectral characteristics of an amplifier with hard compression characteristics. Soft compression results in low order distortion close to the RF carrier, whereas hard compression spreads the distortion across a wider bandwidth.

Soft compression is achieved by soft clipping and hard compression is achieved by hard clipping. The clipping level of the PA supply voltage is indicated by trace 216 of FIG. 5. The shaping function 214 shows no further rise in supply voltage for a rise in input power once the clipping level is reached. In the case of soft clipping the transition from the unclipped region of the shaping function at medium power to the clipped region of the shaping function at high power is gradual. In the case of hard clipping this transition is abrupt.

The ability to control the frequency domain distortion characteristic via the shaping table is valuable, as it allows control of the trade-off between key system parameters such as regulatory transmit emission requirements and efficiency. This allows the efficiency of the amplifier to be increased through use of crest factor reduction. The amount of crest factor reduction and the shape of the clipping characteristic can be optimised to maximise efficiency commensurate with still meeting the transmitter spectral emissions requirements The dependence of efficiency on peak-to-average power ratio (PAPR) is now explained with reference to FIGS. 4(a) and 4(b).

Figure 4A:
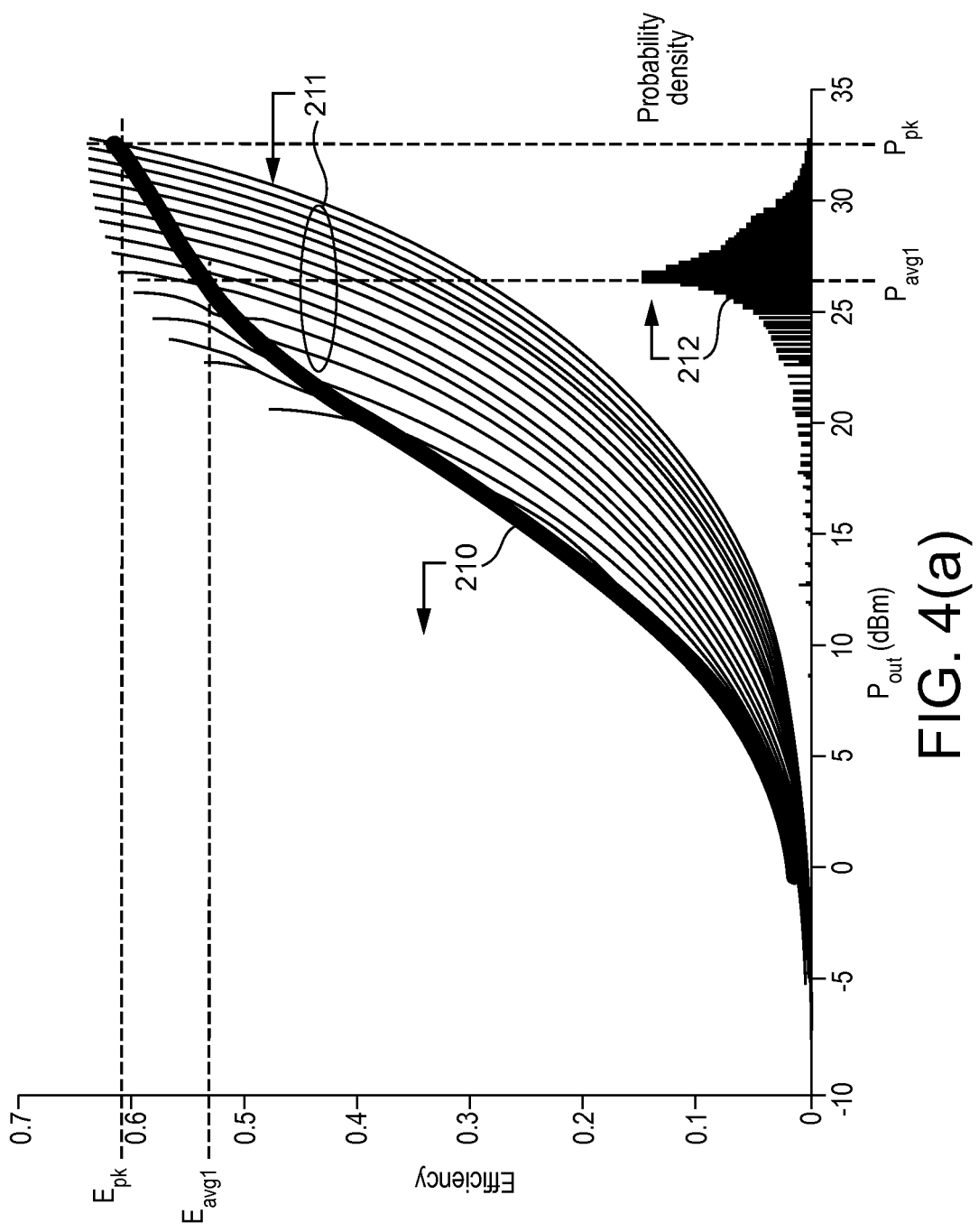
FIGS. 4(a) and 4(b) illustrate plots of efficiency against output power and signal probability density functions for exemplary amplifiers.
Figure 4B:
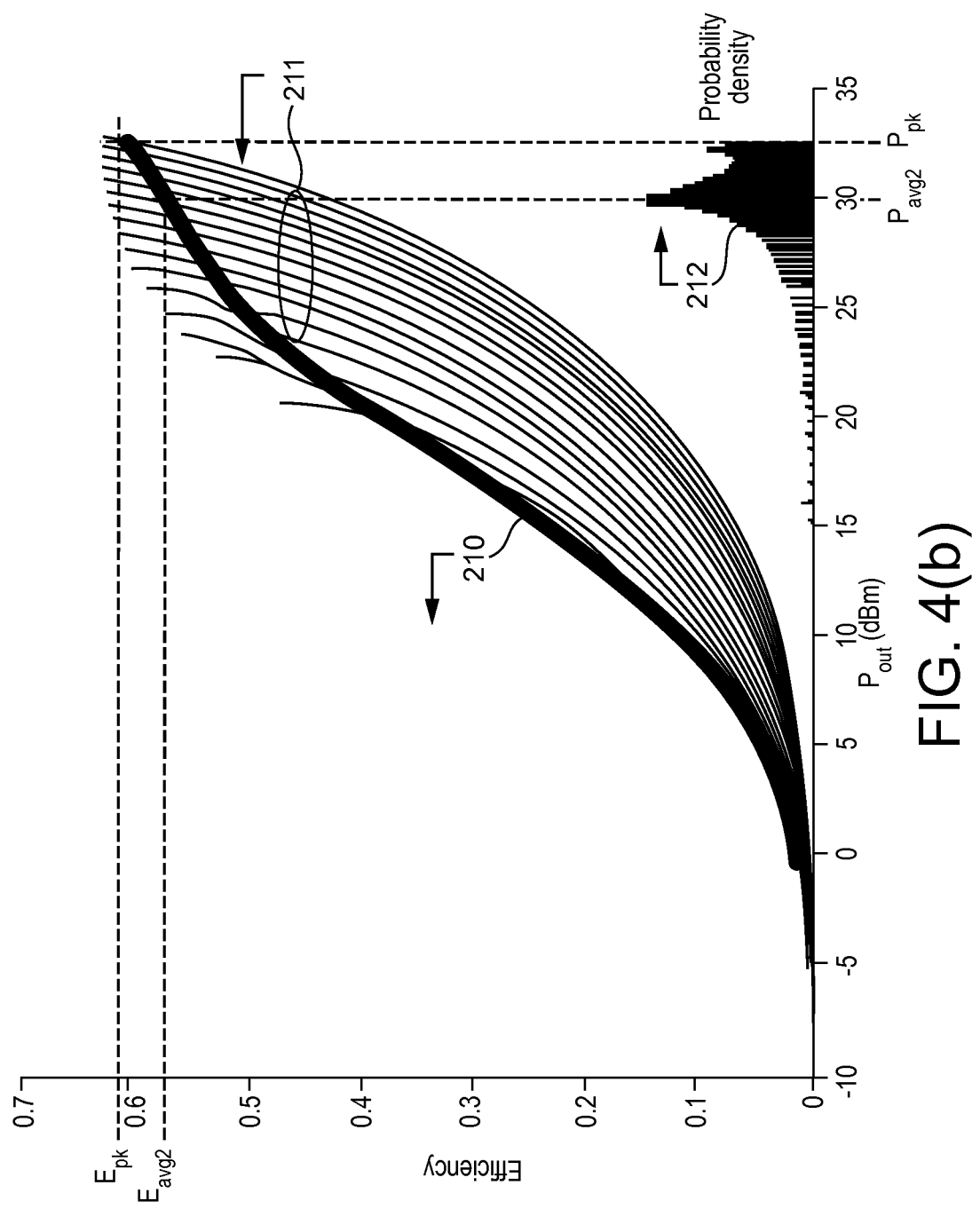

The traces denoted by reference numeral 211 in FIGS. 4(a) and 4(b) show the efficiency versus output power of an RF amplifier at various fixed supply voltages. Trace 210 in FIGS. 4(a) and 4(b) shows the efficiency versus output power of an envelope tracked RF amplifier in which the supply voltage dynamically tracks the instantaneous RF power.

Trace 212 of FIG. 4(a) illustrates the probability density of a typical 3G/4G waveform. In FIG. 4(a) the values of the shaping table have been chosen to achieve a linear amplitude response. No clipping occurs, and the crest factor of the signal is $P_{PK}/P_{AVG1}$.

In FIG. 4(b), the values of the shaping table have been chosen so as to deliberately introduce soft-clipping. The probability density function of the output is shown by trace 213. The peak power of the amplifier of FIG. 4(b) is the same as that of FIG. 4(a), but the peaks occur more frequently. The average power $P_{AVG2}$ of P the amplifier of FIG. 4(b) is higher than the average power $P_{AVG1}$ of the amplifier of FIG. 4(a), and hence the crest factor $P_{PK}/P_{AVG2}$ is reduced.

It can be seen that the average efficiency $E_{AVG2}$ of the amplifier of FIG. 4(b) is higher than the average efficiency $E_{AVG1}$ of the amplifier of FIG. 4(a).

Figure 5:
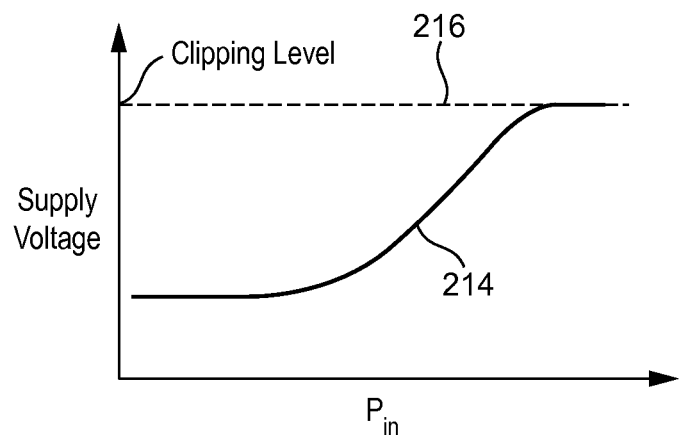
FIG. 5 illustrates an exemplary shaping function.
Figure 6:
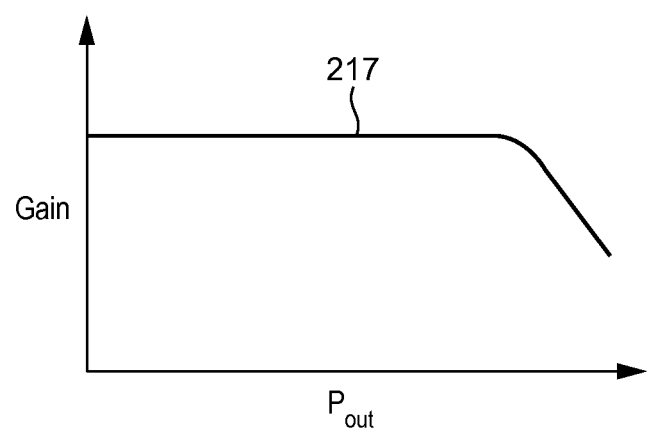
FIG. 6 illustrates the gain of an exemplary envelope tracking power amplifier in which the invention is implemented

FIG. 5 illustrates an exemplary shaping function 214 which maps input power to power amplifier supply voltage. A clipping level 216 is shown, which represents the clipping which would be associated with an arrangement such as FIG. 2(b) above, providing the spectral characteristics of FIG. 3(b) or 3(c), to achieve crest factor reduction. The resulting power amplifier AM/AM (gain) characteristic is illustrated in FIG. 6

Thus, in accordance with the invention, crest-factor reduction may be implemented by choosing appropriate shaping table values. In implementing crest factor reduction, soft-clipping or hard-clipping may be used. The characterisation of the device can include varying the level of clipping (i.e. the extent of crest factor reduction) as well as the sharpness of the clipping (soft/hard), in order to determine the lowest possible crest factor reduction that can be obtained (to increase average power) subject to still complying with regulatory requirements concerning spectral distortion in the frequency domain.

Furthermore it has been shown that implementing crest factor reduction using the shaping table increases the power amplifier efficiency.

In accordance with the invention, the power amplifier characterisation database is used to determine the optimum shaping function to meet desired system objectives. By reducing the crest factor, introduction of a controlled and deliberate amount of distortion is inevitable. This is acceptable, provided regulatory limits are adhered to. Regulatory limits may determine the extent to which crest factor reduction can be applied.

Figure 7:
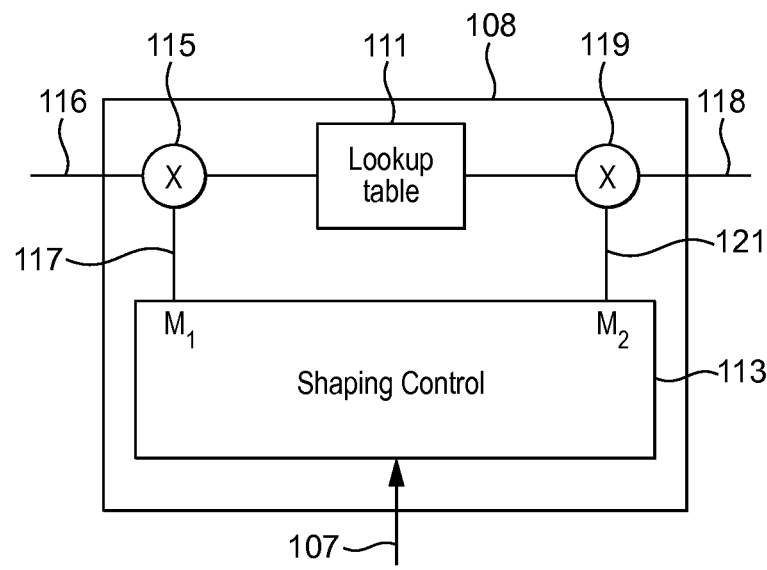
FIG. 7 illustrates a modification to the amplification system of FIG. 1 in accordance with an example embodiment.

The shaping table may also optionally be used to apply crest factor reduction to signals backed-off from maximum power. This may be implemented either by directly replacing the shaping table values or by multiplying the input and/or output of the shaping table by a scale factor as illustrated in an exemplary embodiment shown in FIG. 7. In this embodiment the values in the lookup table are not altered and the average input on line 107 is mapped by shaping control block 113 to lookup table 111 input and output scaling factors m1 and m2 on lines 117 and 121. The scaling factors m1 and m2 are used to control multipliers 115 and 119 which scale the input to and output from the lookup table 111.

In an alternative arrangement, the shaping table 108 values may be directly updated in dependence on the average input power indicated by the signal on line 107. The revised shaping table values are determined from the PA characterisation database.

Figure 8:
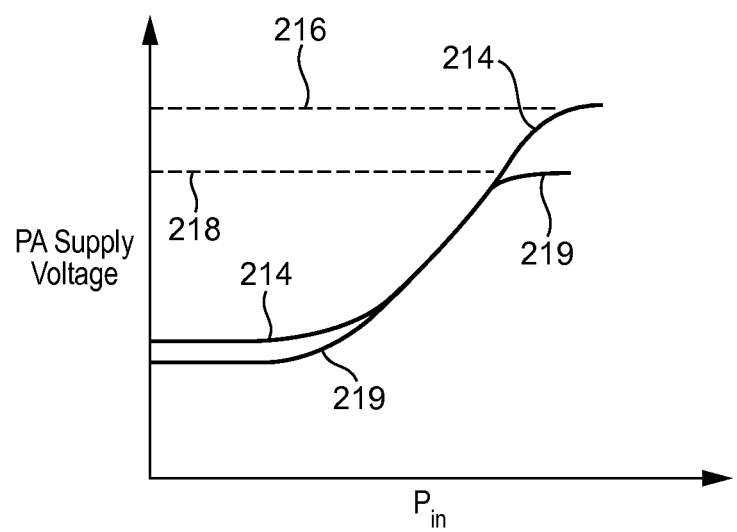
FIG. 8 illustrates a comparison of a shaping function of the present invention at full power and backed off power.

FIG. 8 shows the original shaping function 214 and the revised shaping function 219. The revised shaping function introduces soft clipping at a lower power level and may optionally also lower the minimum applied power amplifier voltage. The revised shaping function improves the back-off efficiency of the power amplifier and the supply modulator, whilst still allowing the power amplifier to comply with regulatory transmit spectrum emission limits.

Figure 9:
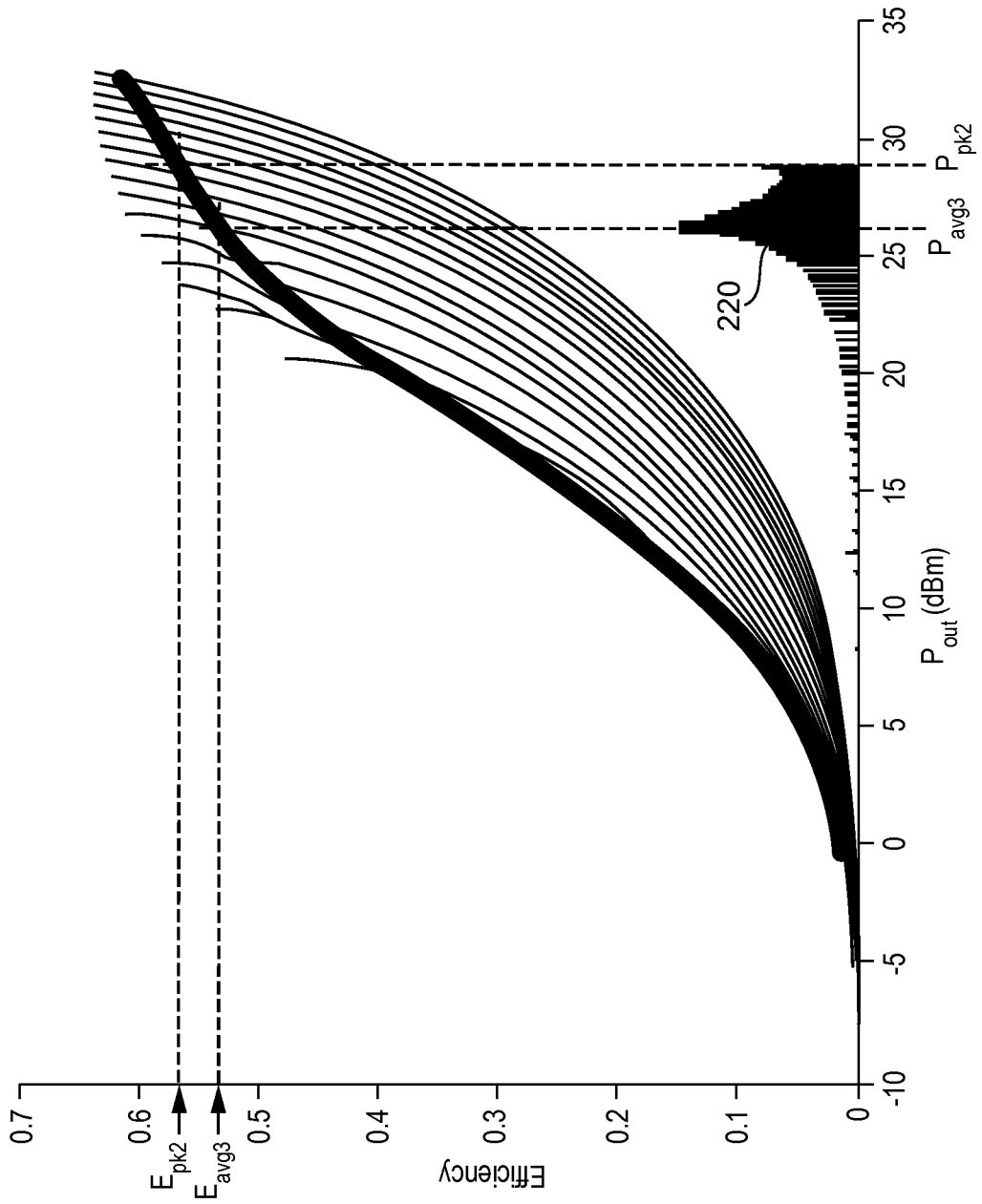
FIG. 9 illustrates a probability density function of an exemplary envelope tracking power amplifier operating at backed off power in which the invention is implemented.

Trace 220 of FIG. 9 shows the probability density function of an envelope tracking power amplifier in which a revised shaping function (e.g. 219 of FIG. 8) is used.

The present invention may be implemented in any envelope tracking amplifier architecture. Such architectures may be found in mobile communications systems, in Wireless infrastructure transmitters, TV transmitters or in mobile telephony devices (handsets).

The invention has been described herein by way of reference to particular examples and embodiments, which are useful for understanding the invention and understanding preferred implementations of the invention. The invention is not, however, limited to the specifics of any given embodiment, nor are the details of any embodiment mutually exclusive. The scope of the invention is defined by the appended claims.

The invention claimed is:

1. A method of controlling an input to an envelope modulated power supply of an envelope tracking amplification stage, the method comprising:
    generating an envelope signal representing an envelope of a signal to be amplified;
    applying a shaping function to the envelope signal to generate a shaped envelope signal, wherein the applying comprises clipping the shaped envelope signal at high values of the envelope signal; and
    providing the shaped envelope signal as the input to the envelope modulated power supply.

2. The method of claim 1 wherein the clipping of the shaped envelope signal results in reduction of a crest factor of an amplifier output signal.

3. The method of claim 2 wherein the clipping of the shaped envelope signal results in increased average power and increased power amplifier efficiency.

4. The method of claim 1 further comprising adjusting a sharpness of the clipping.

5. The method of claim 1 wherein a clipping level of the shaped envelope signal is adjusted in dependence on an average transmitter power.

6. The method of claim 1 wherein a clipping level of the shaped envelope signal is reduced when an average transmitter power is reduced.

7. The method of claim 1, wherein the clipping of the shaped envelope signal comprises scaling at least one of an input to and/or an output from a shaping table.

8. The method of claim 1, wherein the clipping of the shaped envelope signal comprises replacing an existing shaping function with a modified shaping function.

9. The method of claim 1, wherein the applying further comprises not clipping the shaped envelope signal at low values of the envelope signal.

10. The method of claim 1, wherein:
    the generating comprises generating a control signal and the envelope signal representing the envelope of the signal to be amplified by using a detector; and
    the applying comprises applying the shaping function to the envelope signal using a shaping table block to generate the shaped envelope signal responsive to the control signal.

11. An envelope tracking amplification stage including an envelope modulated power supply and an amplifier, the envelope tracking amplification stage further comprising:
    a shaping block adapted to apply a shaping function to an envelope signal representing an envelope of a signal to be amplified by the amplifier to generate a shaped envelop signal, wherein the shaping block is further adapted to clip the shaped envelope signal at high values of the envelope signal.

12. The envelope tracking amplification stage of claim 11, wherein the clipping of the shaped envelope signal results in reduction of a crest factor of an amplifier output signal.

13. The envelope tracking amplification stage of claim 12, wherein the clipping of the shaped envelope signal results in increased average power and increased efficiency of the amplifier.

14. The envelope tracking amplification stage of claim 11, wherein the shaping block is further adapted to adjust a sharpness of the clipping.

15. The envelope tracking amplification stage of claim 14, wherein the shaping block is adapted to adjust a clipping level of the shaped envelope signal in dependence on an average transmitter power.

16. The envelope tracking amplification stage of claim 14, wherein the shaping block is adapted to adjust a clipping level of the shaped envelope signal if an average transmitter power is reduced.

17. The envelope tracking amplification stage of claim 15, further comprising a scaling block for clipping at least one of an input to or an output from the shaping block.

18. The envelope tracking amplification stage of claim 15, wherein the shaping block is further adapted to replace an existing shaping function with a modified shaping function.

19. The envelope tracking amplification stage of claim 11, wherein the shaping block is further adapted to not clip the shaped envelope signal at low values of the envelope signal.

20. The envelope tracking amplification stage of claim 11, further comprising a detector, wherein the shaping block is adapted to apply the shaping function to the envelope signal responsive to a control signal from the detector.

* * * * *